Sept. 17, 1968 E. S. RITTNER 3,402,331

SOLID-STATE ACTIVE ELECTRONIC DEVICE AND MICROCIRCUITS CONTAINING SAME

Filed Aug. 2, 1966

INVENTOR.
E. S. RITTNER

BY

AGENT

United States Patent Office 3,402,331
Patented Sept. 17, 1968

3,402,331

SOLID-STATE ACTIVE ELECTRONIC DEVICE AND MICROCIRCUITS CONTAINING SAME

Edmund S. Rittner, White Plains, N.Y., assignor to North American Philips Co., Inc., New York, N.Y., a corporation of Delaware Filed Aug. 2, 1966, Ser. No. 569,645
10 Claims. (Cl. 317—235)

ABSTRACT OF THE DISCLOSURE

A field-effect type of transistor comprising an insulating substrate whose thickness exceeds 2 microns, a gate electrode on one side of the insulator, a layer of active semiconductive or insulating material on the opposite side of the substrate, and source and drain contacts to the active layer. The ratio of channel length L to insulator thickness $h$ is chosen in the range of 1.5–5. Such a device will behave as a dielectric triode exhibiting triode-like electrical characteristics. A microcircuit embodiment of the invention uses a thin resin sheet as the insulator, with the various components printed on opposite sides of the sheet.

Figure 1:
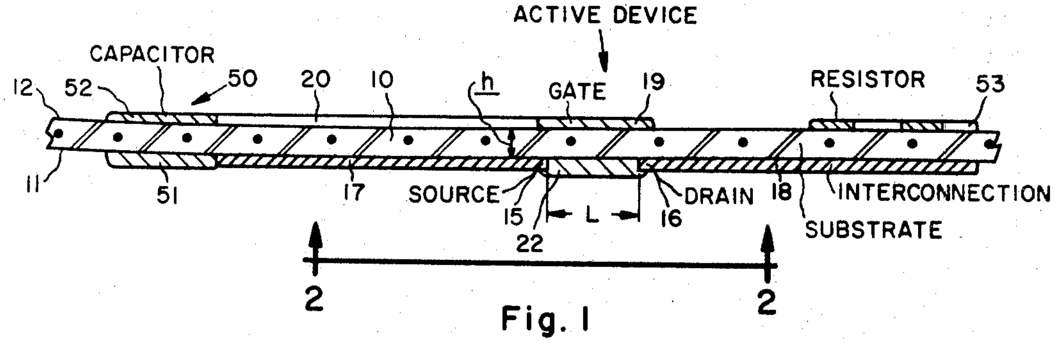

This invention relates to a solid-state device capable of amplification, and in particular to a device having characteristics similar to a triode vacuum tube. It also relates to novel microcircuits employing such devices.

The known insulated gate field-effect transistor (FET) comprises coplanar source and drain electrodes separated by a distance L in contact with a semiconductive material, which in turn is insulated by a relatively thin insulator having a thickness $h$ from a gate electrode. A conducting channel may be established along the surface of the semiconductor for majority charge carriers between the source and drain electrodes on the application of certain voltages to the gate electrode, which increases the carrier concentration in the channel, or the conductivity of the channel may be reduced by depleting it of charge carriers. The direction in which the art is presently progressing is to achieve a high ratio of the length L of the conducting channel to the thickness $h$ of the insulator. Thus, for example, a conventional prior art device made with a channel length of approximately 10 microns will be provided with an insulator with a thickness of approximately 0.15 micron, producing a ratio of $L/h$ equal to 67. To improve the gain-bandwidth product, L should be small. However, to keep the capacitance well above the level of the stray capacitance, $h$ should be made still smaller. This tends toward a high $L/h$ ratio.

There has also been activity in the development of what is known as a dielectric triode, that is, a solid-state device analogous to a triode electron tube which operates on the principle of space charge limited currents in a solid as distinguished from a vacuum. One form of such device has been reduced to practice using cadmium sulphide of high resistivity as the dielectric, which is described in "Solid State Electronics," 6, 193–196 (1963). The geometry is similar to the insulated gate FET above described in that there are coplanar source and drain electrodes in contact with a dielectric and separated from a gate electrode. The application of certain voltages causes the injection of charge carriers from the source electrode operating as a cathode into the dielectric, which carriers flow through the dielectric as a current to the drain electrode acting as a collecting anode. The drain electrical characteristics of such a dielectric triode are similar to the plate characteristics of the electron tube triode analogue, whereas the drain characteristics of the conventional FET are similar to the plate characteristics of a pentode tube. The reduction to practice of the dielectric triode involved an $L/h$ ratio of one or less. However, the device had little commercial value because its voltage gain was less than unity.

I have discovered that certain constructions of a solid-state device of the type described above can be operated as a dielectric triode exhibiting triode-like output characteristics with useful voltage gain. In particular, I have found that when the ratio of channel length L to gate-source spacing or dielectric-insulator thickness $h$ is maintained substantially smaller than that of the conventional FET but in excess of unity, then dielectric triode operation with useful voltage gain can be achieved. A consequence of the smaller $L/h$ ratio is to allow dielectric or insulator thicknesses of the order of microns, in comparison with the order of tenths of a micron which had been employed in the prior art insulated gate FET. This enables the use of commercially-available insulator sheets to isolate the gate electrode from the channel. The preferred geometry of the channel length to insulator or dielectric thickness is selected in the range of 1.5–5.

A major feature of my invention is a microcircuit employing as the active element a dielectric triode of the type described above in which the insulator employed is an insulating sheet. My new microcircuit employs the insulating sheet as the substrate or constructional support for the active element and any other required elements of the circuit, such as capacitors, resistors or others. An important advantage is that the various parts of the active and passive elements can be printed directly onto the insulating sheet as a substrate enabling a very high density of components to be achieved at extremely low cost.

Figure 2:
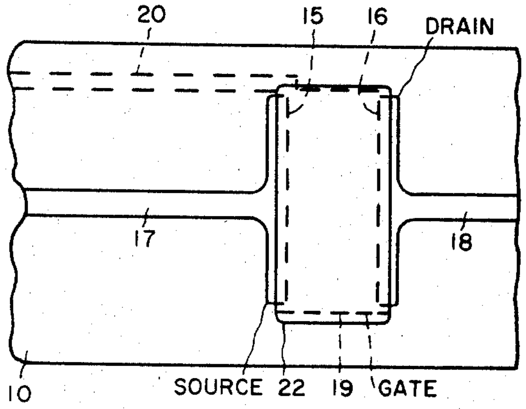
Figure 3:
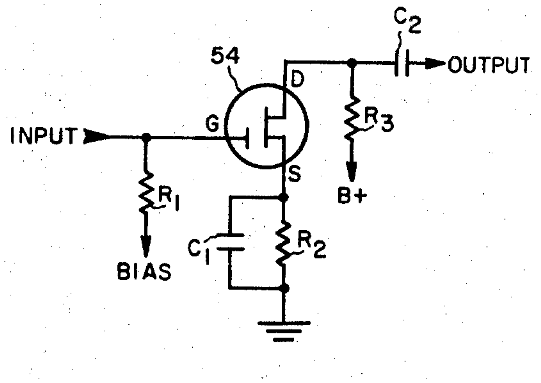
Figure 4:
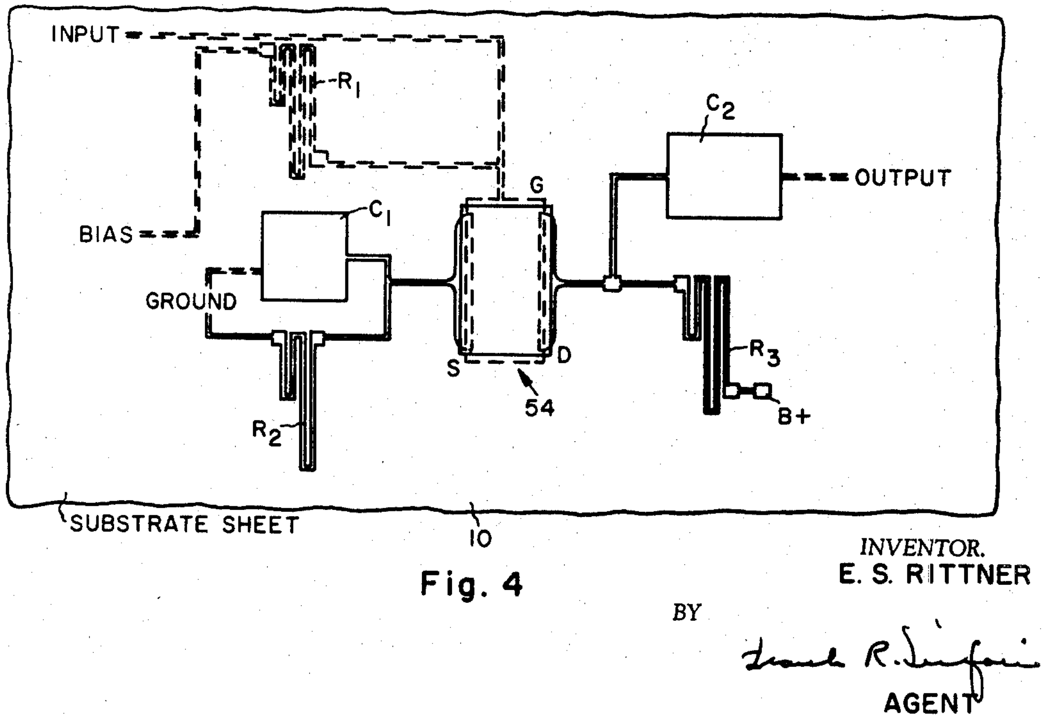

My invention will now be described in greater detail in connection with several embodiments thereof, reference being had to the accompanying drawings wherein: FIG. 1 is a cross-sectional view of one embodiment in accordance with my invention as part of a microcircuit; FIG. 2 is a bottom view of the structure illustrated in FIG. 1; FIG. 3 is a typical dielectric triode amplifying circuit; FIG. 4 illustrates how the circuit of FIG. 3 may be provided on an insulating sheet as a microcircuit in accordance with my invention.

As indicated above, a principal feature of a device made in accordance with my invention is an $L/h$ ratio which is substantially smaller than that of the FET but exceeds unity. In particular, the $L/h$ ratio is chosen in the range of 1.5 to 5. To manufacture such a device, it is desirable to minimize the channel length, as this increases the gain-bandwidth product of the device. One thus desirably chooses the smallest channel length which can be obtained by the current technology. A value of 10 microns for the spacing between the source and drain electrodes is readily obtained. To provide an $L/h$ ratio in the range of 1.5 to 5 thus requires an insulator thickness in the range of 2 to approximately 7 microns. This enables the use of thin sheets of commercially-available insulating material as the insulator. Plastic resin sheets can be used for this purpose, a suitable example being a thin sheet of a polyester film, such as Mylar, ¼ mil thick (approximately 6.3$\mu$). This results in an $L/h$ ratio of 1.58. Since such plastic sheets can be made quite strong, I now can use the insulating sheet as the substrate for the parts which make up the device, rather than, as in the conventional solid-state devices in this area, to provide either a semiconductor crystal as a substrate, or when using semiconductor films to provide an insulating substrate of glass or ceramic. Thus one begins the manufacture of a device in accordance with my invention by printing conductors on the insulating sheet on one side in a pattern which corresponds to the desired geometry of the source and drain electrodes, and on the opposite side in a pattern corresponding to the gate electrode. Any of the printing techniques well known in the art can be used. For example, the electrodes and their interconnections, as well as the active material, can be deposited on the two faces of the insulating layer by thin film deposition, such as vacuum evaporation or sputtering, through masks. Alternatively, thick film techniques, such as silk screening, is suitable. Also, photolithography can be employed for obtaining the desired conductive pattern, similar to the techniques used in printed circuits and integrated circuits. Another technique is the so-called Philips-Dipple technique, involving a photographic physical development process. A copending application, Ser. No. 441,906, filed Mar. 22, 1965, describes the printing of electrical conductors onto layers or sheets of synthetic resins or plastics such as Mylar.

FIGS. 1 and 2 show one form of a device in accordance with my invention. It comprises a substrate 10 in the form of a thin sheet ¼ mil thick of Mylar. On the bottom side 11 of the sheet is printed conductors (thickness exaggerated for clarity) in a pattern as illustrated in FIG. 2 representing the source and drain electrodes, and interconnections. A source electrode 15 is shown at the left and the drain electrode 16 at the right. They each comprise thin, narrow parallel coplanar strips connected to an interconnecting strip 17 and 18, respectively. A suitable material is gold, for example. On the opposite side 12 is provided the gate electrode in the form of a rectangular deposit 19 with its interconnection 20. The active portion 19 preferably exactly overlies the space between the source 15 and drain 16 strips, or slightly overlaps it, to keep the amplification high. In the case of the former, it would be convenient to locate the gate deposit by means of a photographic technique using the source and drain electrodes as negative masks in cooperation with, for example, a photoresist technique.

The action takes place in the device in a layer of insulating or semiconductive material 22 which is deposited as a film on the bottom side 11 of the substrate to overlie and contact the source 15 and drain electrodes 16, as shown in FIG. 1. A suitable material which is already well known in this art is cadmium sulphide, which may be vacuum evaporated to form the deposit 22. Desirably, high resistivity cadmium sulphide of low trap density should be used if satisfactory performance is to be achieved. While I prefer cadmium sulphide because the technology associated with this material for a thin film transistor is well developed, in principle any insulator or semiconductor material in which charge carriers will exhibit a mobility in excess of 1 $cm.^2$/volt-sec. can be employed in a device of my invention. Other well known materials are, for example, cadmium selenide, silicon, tellurium, and tin oxide. It is necessary to relate the active material chosen to the composition of the source and drain electrodes. To operate as a dielectric triode, the source electrode must constitute an injecting contact to the active material. The drain contact may also be constituted of the same material as the source for convenience, or may be a simple ohmic contact.

Those skilled in the art will be fully conversant of the technology required to manufacture the active device of my invention. Thus, cadmium sulphide with a high resistivity of up to $10^7$ ohm-cm. can be manufactured using the technique of double evaporation of CdS and S as taught in J. Appl. Phys., 35, 2730–2732 (1964). Low-trap density cadmium sulphide material can be achieved by the subliming technique described in Proc. Phys. Soc., 80, 1133–1142 (1962). Injecting contacts to the CdS can be made using vacuum evaporated indium. Besides indium, vapor deposited aluminum can be used to make ohmic or electron injecting contacts to the CdS. See Solid State Electronics, 7, 575–582 (1964), which also shows that gold will give a satisfactory injecting contact when the CdS is deposited on the gold. See also RCA Review, 24, 661–675 (1963).

The device as described above is then complete, except for the provision of suitable protective layers or like encapsulation of the active materials, which should be protected against contamination from the outside air. An epoxy cover is suitable. Alternatively, a second sheet of Mylar may be placed over the printed circuit and bonded to the substrate sheet. The second protective sheet can be thicker to reduce its permeability to gases.

In operation, a potential is applied across the drain and source electrode to cause majority carriers injected into the active material to flow from the source to the drain electrode. The gate is used to control the current flow. Since cadmium sulphide is usually n-type, the majority carriers are electrons, and thus the drain is made positive relative to the source. With p-type active material, the polarity is reversed. As the gate or drain field depletes the active material of free charge carriers, it begins to behave like the vacuum of a triode electron tube, and with a sufficient drain voltage, space-charge limited excess carriers can be drawn from the source contact through the active material to the drain. For this reason, the material should initially have a high resistivity and low trap density so that the gate pinch-off voltage can be minimized. For devices with coplanar source and drain electrodes constructed with an $L/h$ ratio in the range of 1.5–5, the device will operate as a dielectric triode with vacuum triode-like operating characteristics. The lower limit of 1.5 ensures a minimum voltage gain for the device of at least approximately 7. When $L/h$ is unity or less, the voltage gain reduces to practically unity, which is unsatisfactory as an amplifier. As $L/h$ increases, the voltage gain increases, but the gain-bandwidth product decreases. When $L/h$ reaches 5, the gain-bandwidth product (L fixed) is degraded by two orders of magnitude, whereas the voltage gain increases to a value of about 1800. Within this range, useful voltage gain and gain-bandwidth product will be exhibited by the device. For example, for a device constructed with an $L/h$ ratio of 1.75, employing an active material, such as CdS, having a mobility of 300 $cm^2$/volt-sec., a voltage gain of about 10 is obtainable with a gain-bandwidth product of over 300 mc. (drain bias about 30 volt).

One of the features of my invention is to use the insulating sheet between the gate and channel as the supporting substrate for the circuit, now that relatively large thicknesses can be employed to satisfy the required $L/h$ ratios. Thus, as illustrated in FIG. 1, the active device is built up using thin or thick film technology on the insulating substrate 10, and any other components necessary for the circuits can by similar thin or thick film technology be mounted on the substrate. For example, a capacitor 50 is shown at the left of FIG. 1. It is constituted of two metal deposits 51 and 52, e.g., of gold, on opposite sides of the sheet 10, with the sheet portion in between serving as the capacitor dielectric. A resistor 53, shown at the right in FIG. 1, is easily formed by printing a zig-zag element of resistive material directly on the substrate. Interconnections to other circuit elements are formed by conductive deposits. Through connections can be made in the sheet 10 for interconnecting elements on opposite sides.

FIG. 3 illustrates a typical dielectric triode amplifier circuit comprising an active device 54, an input resistor $R_1$, source resistor $R_2$ with bypass capacitor $C_1$, a load resistor $R_3$ and coupling capacitor $C_2$. FIG. 4 illustrates how such a circuit may be printed on an insulating substrate 10. The parts in solid lines are printed on one side of the sheet, and the parts in dotted lines printed on the opposite sides. Many other arrangements are equally feasible. After the circuit has been provided, it is desirable to cover it with protective coatings. If desired, the entire circuit can then be encapsulated in a small envelope or package with terminals or pins for mounting on a chassis, circuit board or the like. The insulating substrate 10 need not be flexible but may also be rigid, with thicknesses ranging from about several microns up to about 1 mil. Not only are plastics suitable, but also inorganic insulators, such as $TiO_2$, $BaTiO_3$ and mica, which are available in the form of thin discs. $TiO_2$ and $BaTiO_3$, with their high dielectric constant, will enable the obtention of large value capacitors and large transconductance dielectric triodes with small area electrodes.

These devices so far described employed a separate insulator for isolating the gate from the active material, and thus the symbol $h$ has been used to designate the thickness of the insulator, i.e., the substrate 10 in FIG. 1. However, those skilled in the art will appreciate that the functions of the active material and insulator can be combined in a single material. For instance, a single crystal wafer of CdC can be employed as the substrate, with injecting source and drain contacts printed on one surface of the wafer, and with a gate electrode provided on the opposite surface to form a blocking layer with the CdS to achieve the necessary isolation. In this case, therefore, the value of $h$ is determined by the thickness of the crystal wafer, as the carrier flow will take place in a surface layer substantially coplanar with the source and drain contacts.

Among the advantages of the invention is the low-cost construction possible using well-known thin or thick film technology, in which the source and drain electrodes and active material are deposited on the same side of the insulating substrate, with the gate electrode on the opposite side. Another important advantage is that the source and drain electrodes need not form $p$–$n$ junctions with the active material. Thus, the temperatures required to prepare the devices are well below that required in conventional semiconductor technology.

While I have described my invention in connection with specific embodiments and applications other modifications thereof will be readily apparent to those skilled in this art without departing from the spirit and scope of the invention as defined in the appended claims.

What is claimed is:

1. A solid state electronic device exhibiting triode-like electrical characteristics comprising a thin insulating supporting substrate having a thickness $h$ greater than 2 microns, a conductive deposit serving as a gate electrode on one surface of the substrate, a layer of an active material selected from the group consisting of semiconductive and insulating materials in which charge carriers have a mobility exceeding 1 $cm.^2$/volt-sec. on the opposite surface of the sustrate, and substantially coplanar source and drain contacts to spaced portions of the active material defining a current path having a length L, the ratio of $L/h$ having a value in the range of 1.5–5.

2. A device as set forth in claim 1 and including means for applying to the source contact a potential causing the injection of majority charge carriers through the active material, means for applying to the drain contact a potential for collecting said injected majority carriers, and means for applying a potential to the gate electrode for controlling the flow of carriers through the active material.

3. A device as set forth in claim 1 wherein the gate electrode and source and drain contacts are printed deposits on the substrate, and the substrate has lateral dimensions exceeding those of the gate electrode and the source and drain contacts.

4. A device as set forth in claim 3 wherein the substrate is a thin flexible sheet of a plastic resin.

5. A device as set forth in claim 4 wherein the plastic is a polyester film.

6. A device as set forth in claim 3 wherein the substrate is an inorganic material with a high dielectric constant.

7. A device as set forth in claim 1 wherein the active material is selected from the group consisting of cadmium sulphide, cadmium selenide, tellurium, silicon, and tin oxide.

8. A microcircuit comprising a thin insulating substrate having a thickness $h$ exceeding 2 microns; an active circuit element on said substrate; said active element comprising a gate electrode deposited on one surface of said substrate, a layer of semiconducting or insulating material on the opposite surface of said substrate, and source and drain electrode contacts to the material defining a current path having an length L, the ratio of $L/h$ having a value in the range of 1.5–5; at least one further circuit element printed on the substrate; and interconnections between the circuit elements printed on the substrate.

9. A microcircuit as set forth in claim 8 wherein the further circuit element is a capacitor comprising conductive electrodes deposited on opposite sides of the substrate as the capacitor dielectric.

10. A microcircuit as set forth in claim 8 wherein the further circuit element is a resistor printed on one surface of the substrate.

References Cited

UNITED STATES PATENTS

| | | | |
|---|---|---|---|
| 2,524,033 | 10/1950 | Bardeen | 317—235 |
| 2,898,477 | 8/1959 | Hoesterey | 317—235 |
| 3,258,663 | 6/1966 | Weimer | 317—235 |
| 3,289,093 | 11/1966 | Wanlass | 317—235 |

JOHN W. HUCKERT, *Primary Examiner.*

J. D. CRAIG, *Assistant Examiner.*